United States Patent [19]

Malhi

[11] Patent Number: 5,406,096
[45] Date of Patent: Apr. 11, 1995

[54] DEVICE AND METHOD FOR HIGH PERFORMANCE HIGH VOLTAGE OPERATION

[75] Inventor: Satwinder Malhi, Garland, Tex.

[73] Assignee: Texas Instruments Incorporated, Dallas, Tex.

[21] Appl. No.: 194,771

[22] Filed: Feb. 9, 1994

Related U.S. Application Data

[63] Continuation of Ser. No. 21,289, Feb. 22, 1993, abandoned.

[51] Int. Cl.⁶ .................. H03K 17/08; H03K 17/689; H01L 27/02
[52] U.S. Cl. ............................ 257/114; 257/500; 257/501; 257/139; 257/140; 257/701; 257/783; 257/736; 257/748
[58] Field of Search ............... 257/500, 501, 139, 140, 257/141, 142, 143, 144, 145, 214, 134, 392, 779, 701, 783, 736, 748; 307/584; 315/219

[56] References Cited

U.S. PATENT DOCUMENTS

| | | | |
|---|---|---|---|
| 3,244,948 | 4/1966 | Cooper | 257/782 |
| 4,450,471 | 5/1984 | Wellhoefer et al. | 257/782 |
| 4,595,847 | 6/1986 | Weir | 307/584 |
| 5,040,043 | 8/1991 | Ohno et al. | 257/140 |

FOREIGN PATENT DOCUMENTS 3072477  12/1976  Japan ................... 257/134

OTHER PUBLICATIONS

J. W. Palmour, et al. "Characterization of Device Parameters In High-Temperature Metal-Oxide-Semiconductor field-effect transistors in β-SiC Thin Films", 26 Apr. 1988, extracted from: J. Appl. Phys. 64(4), 15 Aug. 1988, pp. 2168-2177.

J. Haisma, et al. "Silicon-On-Insulator Wafer Bonding-Wafer Thinning Technological Evaluations", 20 May 1989, pp. 1426-1443.

R. D. Black, et al. "Silicon and Silicon Dioxide Thermal Bonding for Silicon-On-Insulator Applications", 8 Dec. 1987, extracted from: J. Appl. Phys. 63(8), 15 Apr. 1988, pp. 2773-2777.

Hiroshi Gotou, et al. "SOI-Device on Bonded Wafer", 25 Dec. 1988, pp. 407-418, extracted from: Fujitsu Scientific & Technical Journal vol. 24, No. 4.

Robert F. Davis, et al. "Thin Film Deposition and Microelectronic and Optoelectronic Device Fabrication and Characterization in Monocrystalline Alpha and Beta Silicon Carbide", extracted from: IEEE vol. 79, No. 5, May 1991, pp. 677-701.

K. Furukawa, et al. "Insulated-Gate and Junction-Gate FET's of CVD-Grown β-SiC", extracted from: IEEE vol. EDL-8, No. 2, Feb. 1987, pp. 48-49.

K. Shibahara, et al. "Inversion-Type N-Channel MOSFET Using Antiphase-Domain Free Cubic-SiC Grown on Si(100)" extracted from: (1986 International) Conference on Solid State Device and Materials, Tokyo, 1986, pp. 717-720.

Semiconductor Devices, Physics and Technology S. M. Sze, 1985.

'The Switch and the Invertor'.
Semi Conductor Devices, S. M. Sze, 1985.

*Primary Examiner*—William L. Sikes
*Assistant Examiner*—Fetsum Abraham
*Attorney, Agent, or Firm*—Jacqueline J. Garner; Richard L. Donaldson; William E. Hiller

[57] ABSTRACT

A high voltage device (10) having MOS input characteristics. A low voltage MOS transistor (12) is provided which has a source (18), a drain (22), and a gate (25). A high voltage transistor (14) is also provided which has a source (20), a drain (24), and gate (16). The source (18) of the low voltage MOS transistor (12) is connected to the gate (16) of the high voltage transistor (14). The drain (22) of the low voltage MOS transistor (12)is connected to the source (20)of the high voltage transistor The low voltage MOS transistor (12) may have a silicon substrate and the substrate of the high voltage transistor (14)may comprise silicon, silicon carbide, or gallium arsenide.

12 Claims, 4 Drawing Sheets

DEVICE AND METHOD FOR HIGH PERFORMANCE HIGH VOLTAGE OPERATION

This application is a Continuation of application Ser. No. 08/021,289, filed Feb. 22, 1993, now abandoned.

FIELD OF THE INVENTION

This invention generally relates to semiconductor devices and processes and more specifically to power MOSFETs.

BACKGROUND OF THE INVENTION

A growing segment of the semiconductor business is high voltage/high power devices and integrated circuits. A critical element in this business is the power MOSFET. Power MOSFETs have many diverse applications in automotive, communications, consumer, data processing, industrial and military markets. For example, power MOSFETs may be used as drivers for motors, lamps, or displays. Most power MOSFETs are built in silicon. However, the performance of power MOSFETs built in silicon are already close to their theoretical limits.

A common device structure for power MOSFETs is a vertical structure. In the vertical device (100) of FIG. 1, the gate (102) and source (104) terminals are at the top surface and the drain terminal (106) is at the bottom. The carrier flow path is from the top source electrode (104), through the lateral channel (114) underneath the gate electrode (102), then vertically through the drift region (108) and n+ substrate (110), to the drain electrode (106). In silicon, the p-well (112) is typically 2–5 microns deep, and the drift region (108) is typically 5–30 microns deep for devices with breakdown voltage ratings in the 50–400 V range. This device structure is used primarily for discrete devices.

SUMMARY OF THE INVENTION

Generally, and in one form of the invention, a high voltage device having MOS input characteristics is disclosed. A low voltage MOS transistor is provided which has a substrate, a source, a drain, and a gate. A high voltage transistor is also provided which has a substrate, a source, a drain, and a gate. The source of the low voltage MOS transistor is connected to the gate of the high voltage transistor. The drain of the low voltage MOS transistor is connected to the source of the high voltage transistor. The breakdown voltage of the low voltage MOS transistor is higher than the depletion threshold voltage of the high voltage transistor.

An advantage of the invention is providing an improved high voltage device.

A further advantage of the invention is providing an improved high voltage device having MOS input characteristics.

A further advantage of the invention is providing an improved high voltage device having reduced input capacitance.

Other advantages will be apparent to those of ordinary skill in the art having reference to the following specification in conjunction with the drawings.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
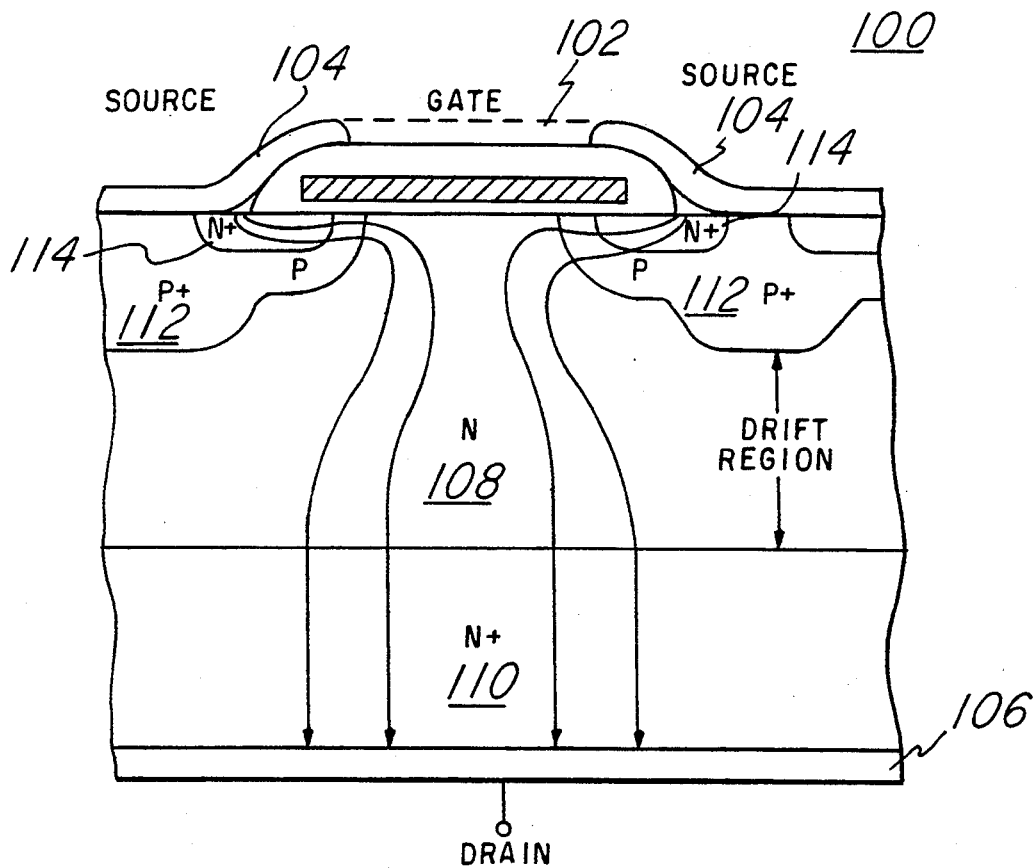
FIG. 1 is a cross-sectional view of prior art vertical MOSFET built in Silicon.
Figure 2:
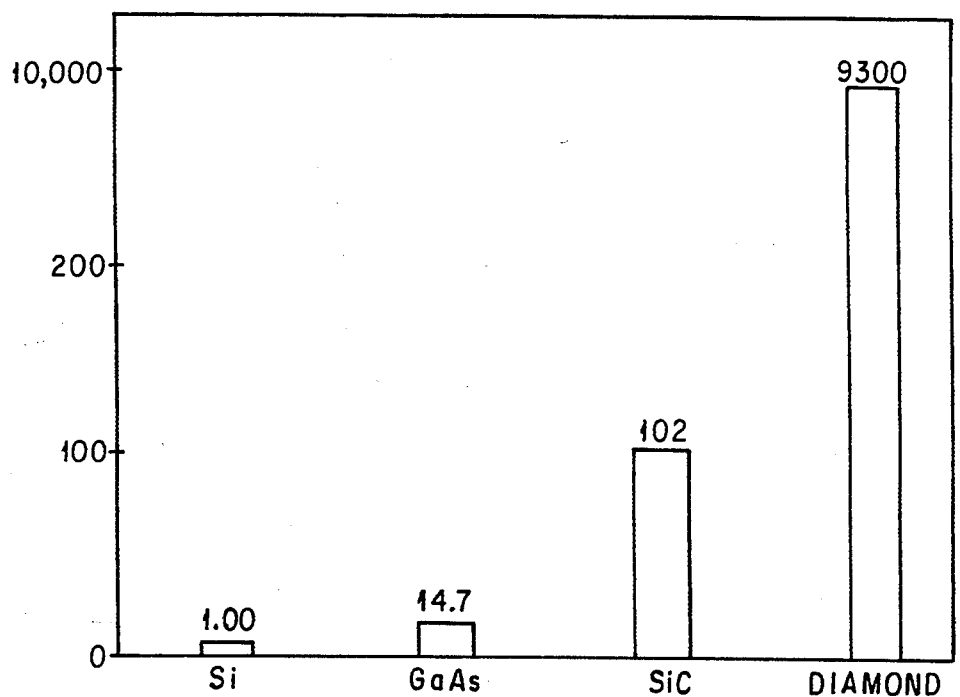
FIG. 2 is a plot of 1/Rsp characteristics for various materials.

The power MOSFET is a switch, much like an electromechanical relay is a switch, but it is much smaller, more reliable, and can be electronically controlled. The key performance figure for the power MOSFET is specific on-resistance (Rsp), or the resistance of this switch per unit die area when the device is switched on. A goal in power MOSFET technology is reducing the specific on-resistance as much as possible. This leads to 1/Rsp as a convenient figure of merit which should be maximized. The Rsp, depends on the semiconductor material properties, and the figure of merit can be written as $$\text{FIGURE OF MERIT} = 1/\text{Rsp} \sim = \epsilon^* \mu^* E_c^3$$

where $\epsilon$ is the dielectric constant, $\mu$ is the carrier mobility, Ec is the avalanche electric field, and V is the breakdown voltage rating of the device. Table I lists the properties of a few candidate materials and FIG. 2 plots the 1/Rsp figure of merit.

TABLE 1

| | | Material Properties and Figure of Merit | | | |
|---|---|---|---|---|---|
| Parameter | Symbol | Units | Si | GaAs | SiC |
| Relative Dielectric Constant | $\epsilon$ | C/V · cm | 11.8 | 12.8 | 9.7 |
| Mobility | $\mu$ | cm$^2$/V · sec | 1400 | 8000 | 300 |
| Critical Field | $E_c$ | V/cm | $3 \times 10^5$ | $4 \times 10^5$ | $2.5 \times 10^6$ |
| Figure of Merit Factor | $\epsilon^* \mu^* E_c^3$ | — | $4.46 \times 10^{20}$ | $6.55 \times 10^{21}$ | $4.55 \times 10^2$ |
| Relative Figure of Merit | — | — | 1 | 14.7 | 102 |

Gallium arsenide (GaAs) and silicon carbide (SIC) have the potential of at least an order of magnitude improvement in performance in making high voltage devices. However, making enhancement mode MOSFETs in either GaAs or SiC is difficult. For example, GaAs technology has problems producing a high quality gate insulator. Accordingly, a high voltage device having improved MOS input characteristics over prior art high voltage silicon MOSFETs is desired. It is also desired to have a high voltage device having MOS input characteristics which achieves the higher performance available with GaAs and SiC.

Figure 3:
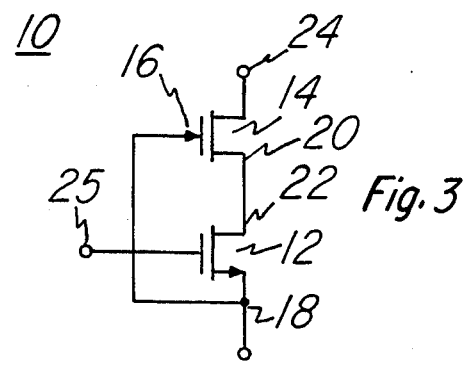
FIG. 3 is a schematic diagram of a high voltage device according to the invention.

A high voltage device 10 having improved MOS input characteristics according to the preferred embodiment of the invention is shown in FIG. 3. A low voltage (LV) MOSFET 12 is implemented in silicon and connected in series with a high voltage (HV) depletion device 14 which is implemented in either GaAs or SiC. HV depletion device 14 may also be implemented in silicon and still have the advantage of a HV device 10 having low input capacitance due to LV MOSFET 12. HV depletion device 14 may be a JFET, MESFET, MOSFET, SIT, or other suitable device. The breakdown voltage of LV MOSFET 12 is higher than the depletion threshold voltage of HV depletion device 14. HV gate 16 is connected to LV source 18. HV source 20 is connected to LV drain 22. HV drain 24 may be connected to Vdd, which may for example be 12 V. LV gate 25 is the input of the high voltage device 10. The series combination allows MOS input control with the higher performance advantages of GaAs or SiC.

Figure 4:
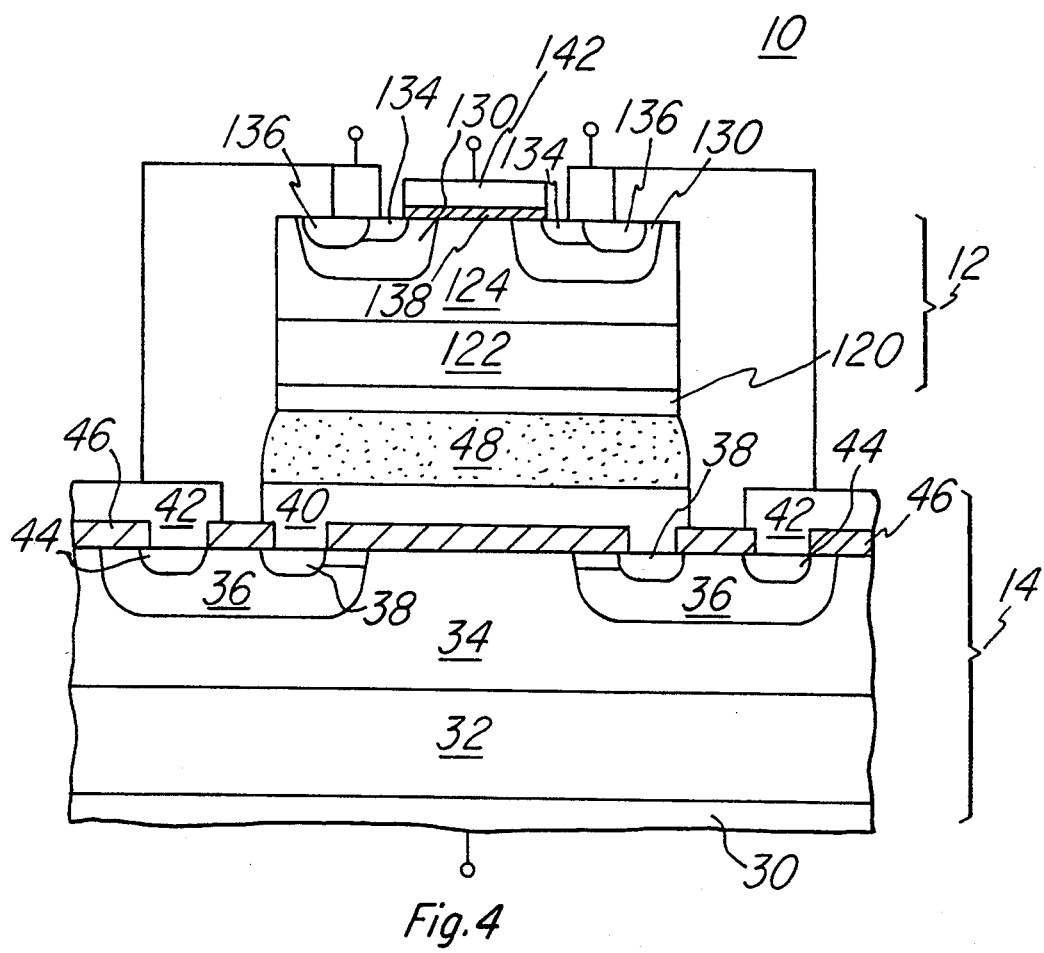
FIG. 4 is a cross-sectional view of a high voltage device according to the invention.

Referring to FIG. 4, a preferred structure for implementing high voltage device 10 will now be described with reference to a JFET built in SiC. Other structures will of course be obvious to those skilled in the art. For example, GaAs may be used instead of SiC or MESFETs, MOSFETs or SITs may be used instead of a JFET. Drain electrode 30 of HV depletion device 14 is located adjacent one side of substrate 32. Substrate 32 may, for example comprise 6H SiC. On the other side of substrate 32 is drift region 34. The p-well 36 is located within drift region 34. Source regions 38 are located at the surface of p-well 36 below source electrode 40. Gate regions 44 are located at the surface of p-well 36 below gate electrodes 42. Insulator layer 46 insulates source electrode 40 and gate electrodes 42 from drift region 34.

Drain electrode 120 of LV MOSFET 12 is connected to source electrode 40 of HV depletion device 14 through solder layer 48. Other methods of connecting drain electrode 120 to source electrode 40, such as wire bonding, will be apparent to those skilled in the art. Substrate 122 is located between drain electrode 120 and drift region 124. The p-wells 130 are located at the surface of drift region 124. The n+ regions 134 and p+ regions 136 are located at the surface of p-wells 130. Gate electrode 142 is separated from the surface of drift region 124 by insulator layer 138.

Figure 5A:
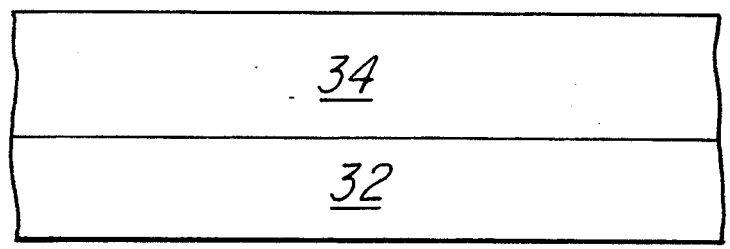
FIGS. 5a–e are cross-sectional views illustrating various states of fabrication of a high voltage depletion device according to the invention.
Figure 5B:
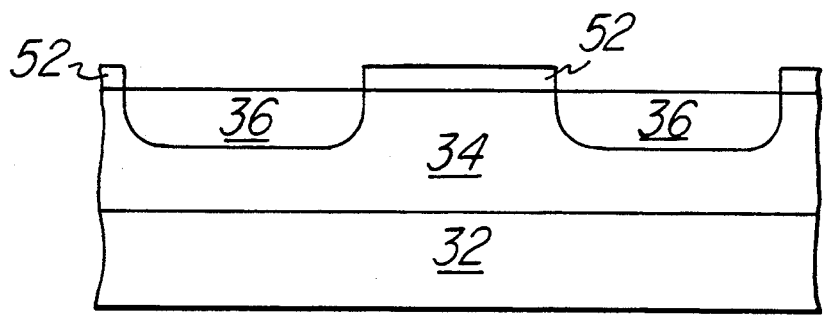

A preferred method for forming HV depletion device 14 of high voltage device 10 will now be described with reference to FIGS. 5a through e. Referring to FIG. 5a, the substrate 32 may comprise n+ 6H SiC. An n-type epitaxial layer is grown on substrate 32 to a thickness on the order of 5 microns, to form drift region 34. Drift region 34 may be doped with phosphorus at a concentration of $5 \times 10^{15}/cm^2$. Referring to FIG. 5b, a layer of masking material 52, such as photoresist, is deposited on the surface of drift region 34 and patterned to expose portions of drift region 34 where p-well 36 is to be formed. P-well 36 is formed via ion implantation of boron at a concentration of $2 \times 10^{13}/cm^2$. P-well 36 may have a depth on the order of 2 microns. P-well 36 may then be annealed at approximately 1500° C. Masking layer 52 is then removed.

Figure 5C:
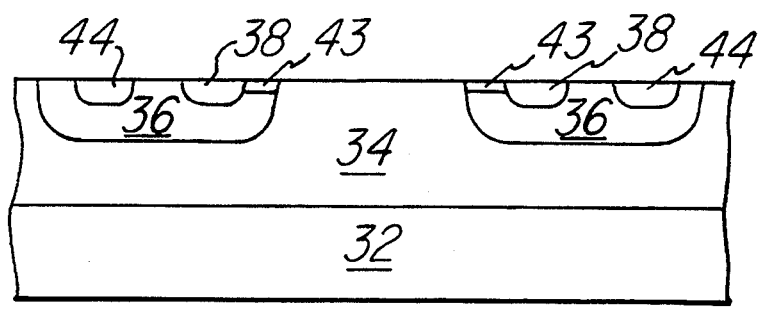

Referring to FIG. 5c, source regions 38 are formed with an ion implantation of phosphorus at a concentration on the order of $2 \times 10^{15}/cm^2$. Gate regions 44 are formed with an ion implantation of boron at a concentration of $2 \times 10^{15}/cm^2$. The n-regions 43 are formed with an ion implantation of phosphorus at a concentration of $2 \times 10^{13}/cm^2$. The source regions 38, gate regions 44, and n-regions 43 are then driven in with an anneal at approximately 1500° C.

Figure 5D:
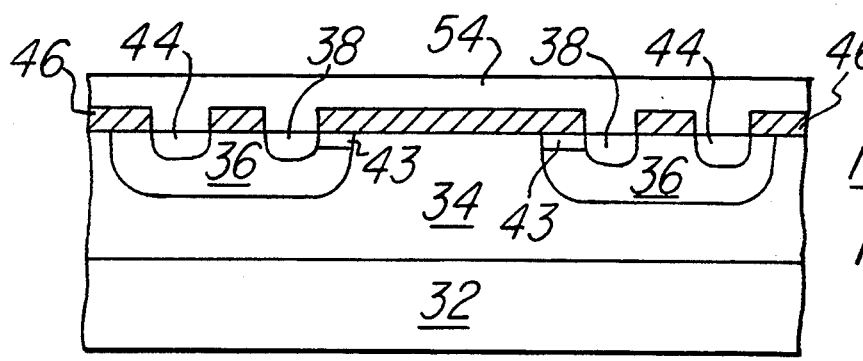
Figure 5E:
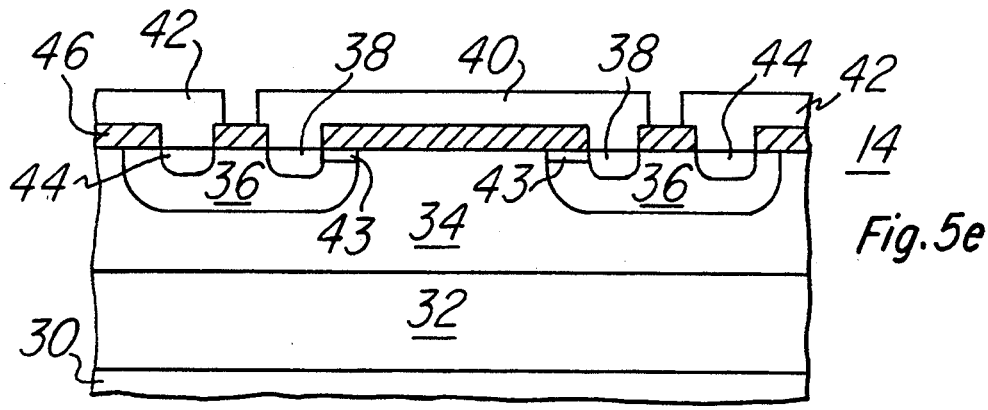

Next, insulator layer 46 is formed, for example by CVD to a thickness of 5000°A. Insulator layer 46 is then patterned and etched to expose the source regions 38 and gate regions 44, as shown in FIG. 5d. Conductive layer 54 is then deposited on insulator layer 46. Conductive layer 54 may comprise, for example, doped or undoped polysilicon. Conductive layer 54 is then patterned and etched to form source electrode 40 and gate electrodes 42, as shown in FIG. 5e. A 1 μm thick aluminum layer is deposited on the back of substrate 32 to form a drain electrode 30.

Figure 6A:
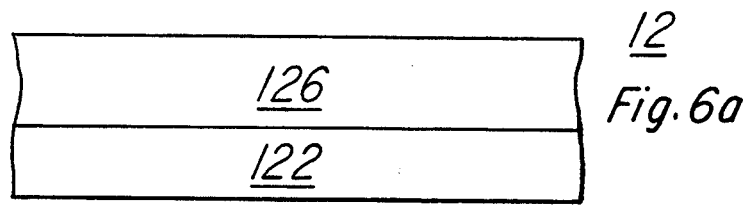
FIGS. 6a–e are cross-sectional views illustrating various states of fabrication of a low voltage MOSFET according to the invention.
Figure 6B:
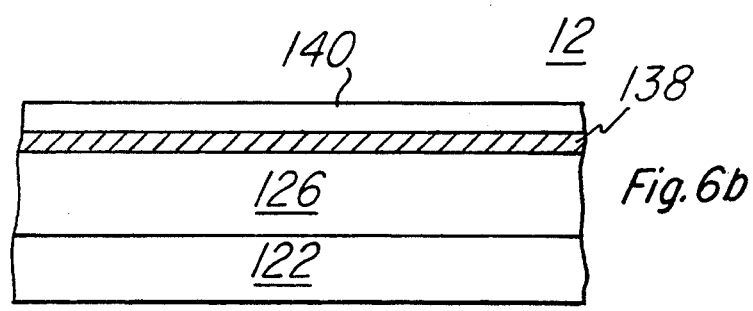
Figure 6C:
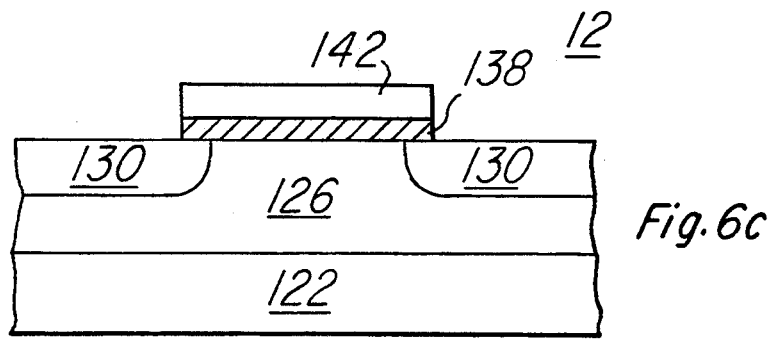

The preferred method of forming LV MOSFET 12 will now be described with reference to FIGS. 6a–e. Referring to FIG. 6a, the substrate 122 is n+ silicon. An n-type epitaxial layer is grown on substrate 122 to a thickness on the order of 4 microns thick to form drift region 126. Drift region 126 may then be doped with phosphorus at a concentration of $1 \times 10^{16}/cm^2$. Next, a gate oxide layer 138 is grown to a thickness of 500 Å and a conductive layer 140 is then deposited on insulator layer 138 as shown in FIG. 6b. Conductive layer 140 may comprise, for example, doped or undoped polysilicon. Conductive layer 140 and insulator layer 138 are then patterned and etched to form gate electrode 142, as shown in FIG. 6c. Then a self aligned p-well 130 may be formed via ion implantation of boron at a concentration of $2 \times 10^{13}/cm^2$. The p-well 130 may have a depth on the order of 2 microns and may then be annealed at approximately 1100° C.

Figure 6D:
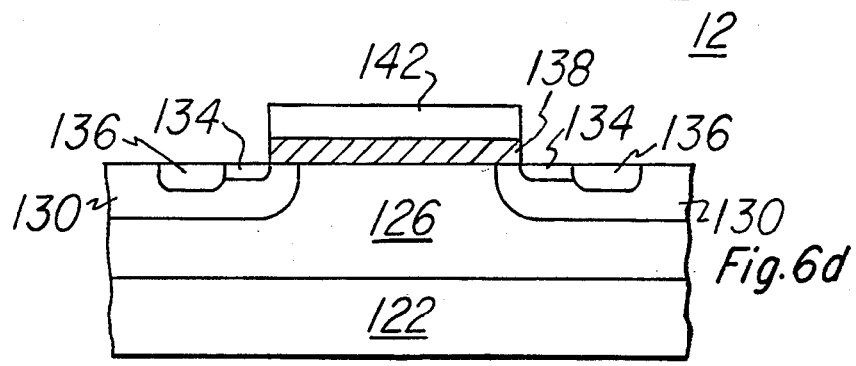

Referring to FIG. 6d, n+ regions 134 may be formed, again self aligned to the gate edges, with an ion implantation of arsenic at a concentration on the order of $2 \times 10^{15}/cm^2$. The p+ regions 136 may be formed with an ion implantation of boron at a concentration on the order of $2 \times 10^{15}/cm^2$. The n+ regions 134 and p+ regions 136 are then driven in with an anneal at approximately 900° C.

Figure 6E:
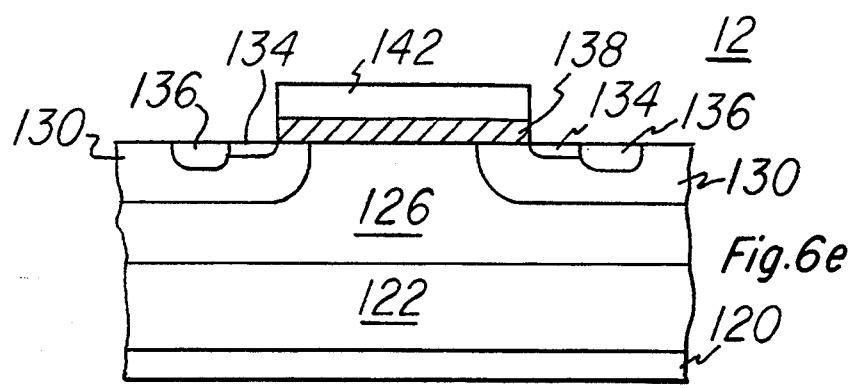

Finally, a 1 μm thick layer of aluminum is deposited on substrate 122 to form drain 130, as shown in FIG. 6e.

Once LV MOSFET 12 and HV depletion device 14 are formed, the drain electrode 130 of LV MOSFET 12 is electrically connected to the source electrode 40 of HV depletion device 14. This may be accomplished in several ways. LV MOSFET 12 and HV depletion device may be electrically connected by depositing a layer of electrically conducting material such as solder on source 40 of HV depletion device 14 and attaching the drain 130 of LV MOSFET 12, as shown in FIG. 4. Other examples will be apparent to those skilled in the art, such as wire bonding the two devices placed side by side. The source regions of LV MOSFET 12 may then be wire bonded to the gate electrodes 42 of HV depletion device 14.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A high voltage device having MOS input characteristics, comprising:
   a. a low voltage MOS transistor having a turn-on voltage of less than five volts, said low voltage MOS transistor having a silicon substrate, a first source, a first drain, and a first gate; and
   b. a high voltage transistor having a breakdown voltage greater than fifty volts, said high voltage transistor having a silicon-carbide substrate, a second source, a second drain, and a second gate, wherein said first source is connected to said second gate and said first drain is connected to said second source such that a breakdown voltage of the low voltage MOS transistor is higher than a depletion threshold voltage of the high voltage transistor.

2. The device of claim 1, wherein said high voltage transistor comprises a depletion mode junction field effect transistor.

3. The device of claim 1, wherein said high voltage transistor comprises a depletion mode MOS field effect transistor.

4. The device of claim 1, wherein said high voltage transistor comprises a depletion mode MESFET.

5. The device of claim 1, wherein said high voltage transistor comprises a depletion mode static induction transistor.

6. The device of claim 1 further comprising a wire bond between said first source and said second gate and a solder layer between said first drain and said silicon-carbide substrate.

7. A high voltage device having MOS input characteristics, comprising:
   e. a low voltage MOS transistor having a turn-on voltage of less than five volts, said low voltage MOS transistor having a silicon substrate, a first source, a first drain, and a first gate; and
   f. a high voltage transistor having a breakdown voltage greater than fifty volts, said high voltage transistor having a gallium-arsenide substrate, a second source, a second drain, and a second gate, wherein said first source is connected to said second gate and said first drain is connected to said second source such that a breakdown voltage of the low voltage MOS transistor is higher than a depletion threshold voltage of the high voltage transistor.

8. The device of claim 7, wherein said high voltage transistor comprises a depletion mode junction field effect transistor.

9. The device of claim 7, wherein said high voltage transistor comprises a depletion mode MOS filed effect transistor.

10. The device of claim 7, wherein said high voltage transistor comprises a depletion mode MESFET.

11. The device of claim 7, wherein said high voltage transistor comprises a depletion mode static induction transistor.

12. The device of claim 7, further comprising a wire bond between said first source and said second gate and a solder layer between said first drain and said gallium-arsenide substrate.

* * * * *